United States Patent
Suekawa et al.

(10) Patent No.: US 9,472,543 B2
(45) Date of Patent: Oct. 18, 2016

(54) WIDE BAND GAP SEMICONDUCTOR DEVICE

(71) Applicant: Mitsubishi Electric Corporation, Tokyo (JP)

(72) Inventors: Eisuke Suekawa, Tokyo (JP); Naoto Kaguchi, Tokyo (JP); Masaaki Ikegami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 135 days.

(21) Appl. No.: 14/223,099

(22) Filed: Mar. 24, 2014

(65) Prior Publication Data

US 2015/0008450 A1  Jan. 8, 2015

(30) Foreign Application Priority Data

Jul. 4, 2013 (JP) ................ 2013-140348

(51) Int. Cl.
| | |
|---|---|
| H01L 27/02 | (2006.01) |
| H01L 27/088 | (2006.01) |
| H01L 21/82 | (2006.01) |
| H01L 21/8252 | (2006.01) |
| H01L 27/06 | (2006.01) |
| H01L 29/66 | (2006.01) |

(Continued)

(52) U.S. Cl.
CPC ....... *H01L 27/0251* (2013.01); *H01L 21/8213* (2013.01); *H01L 21/8252* (2013.01); *H01L 27/0605* (2013.01); *H01L 27/088* (2013.01); *H01L 29/66068* (2013.01); *H01L 29/66712* (2013.01); *H01L 29/7803* (2013.01); *H01L 29/7811* (2013.01); *H01L 29/7815* (2013.01); *H01L 29/0619* (2013.01); *H01L 29/0696* (2013.01); *H01L 29/1608* (2013.01); *H01L 29/2003* (2013.01); *H01L 29/402* (2013.01)

(58) Field of Classification Search
CPC ................ H01L 29/7803–29/7808; H01L 27/0248–27/0296
See application file for complete search history.

(56) References Cited

U.S. PATENT DOCUMENTS 5,602,046 A * 2/1997 Calafut ............... H01L 27/0251
148/DIG. 126
6,545,316 B1 4/2003 Baliga (Continued)

FOREIGN PATENT DOCUMENTS

| JP | 01008674 A * 1/1989 |
|---|---|
| JP | H10-65157 A 3/1998 |

(Continued)

OTHER PUBLICATIONS

An Office Action issued by the Korean Patent Office on Jul. 29, 2015, which corresponds to Korean Patent Application No. 10-2014-0074047 and is related to U.S. Appl. No. 14/223,009; with English language translation.

*Primary Examiner* — William F Kraig
*Assistant Examiner* — Sun M Kim
(74) *Attorney, Agent, or Firm* — Studebaker & Brackett PC

(57) ABSTRACT

The present invention includes a second source layer formed on a surface layer of a p base layer in the same step as that of forming a n$^+$ source layer to sandwich a field insulating film, a second gate electrode being the same layer as a gate polysilicon and formed at least on the field insulating film, a third gate electrode formed on one of portions of the second source layer to be electrically connected to the second gate electrode, and a second source electrode formed on the other portion of the second source layer.

10 Claims, 15 Drawing Sheets

(51) Int. Cl.
    *H01L 29/78*   (2006.01)
    *H01L 29/16*    (2006.01)
    *H01L 29/20*    (2006.01)
    *H01L 29/06*    (2006.01)
    *H01L 29/40*    (2006.01)

(56)        References Cited

U.S. PATENT DOCUMENTS

| | | | |
|---|---|---|---|
| 7,834,407 B2 | 11/2010 | Nakazawa et al. | |
| 8,232,610 B2 | 7/2012 | Nakazawa et al. | |
| 8,592,920 B2 | 11/2013 | Nakazawa et al. | |
| 8,604,563 B2 | 12/2013 | Nakazawa et al. | |
| 8,785,931 B2 * | 7/2014 | Kinouchi | G01K 7/01 |
| | | | 257/368 |
| 2003/0107041 A1 * | 6/2003 | Tanimoto | H01L 29/66068 |
| | | | 257/77 |
| 2005/0127437 A1 * | 6/2005 | Inagawa | H01L 29/0611 |
| | | | 257/330 |
| 2006/0261391 A1 | 11/2006 | Nakazawa et al. | |
| 2012/0049187 A1 | 3/2012 | Haruyama et al. | |
| 2013/0175549 A1 * | 7/2013 | Okumura | H01L 29/66068 |
| | | | 257/77 |

FOREIGN PATENT DOCUMENTS

| | | |
|---|---|---|
| JP | 2005-191052 A | 7/2005 |
| JP | 2006-324570 A | 11/2006 |
| JP | 2012-54378 A | 3/2012 |
| KR | 10-2003-0036239 A | 5/2003 |

* cited by examiner

F I G . 1
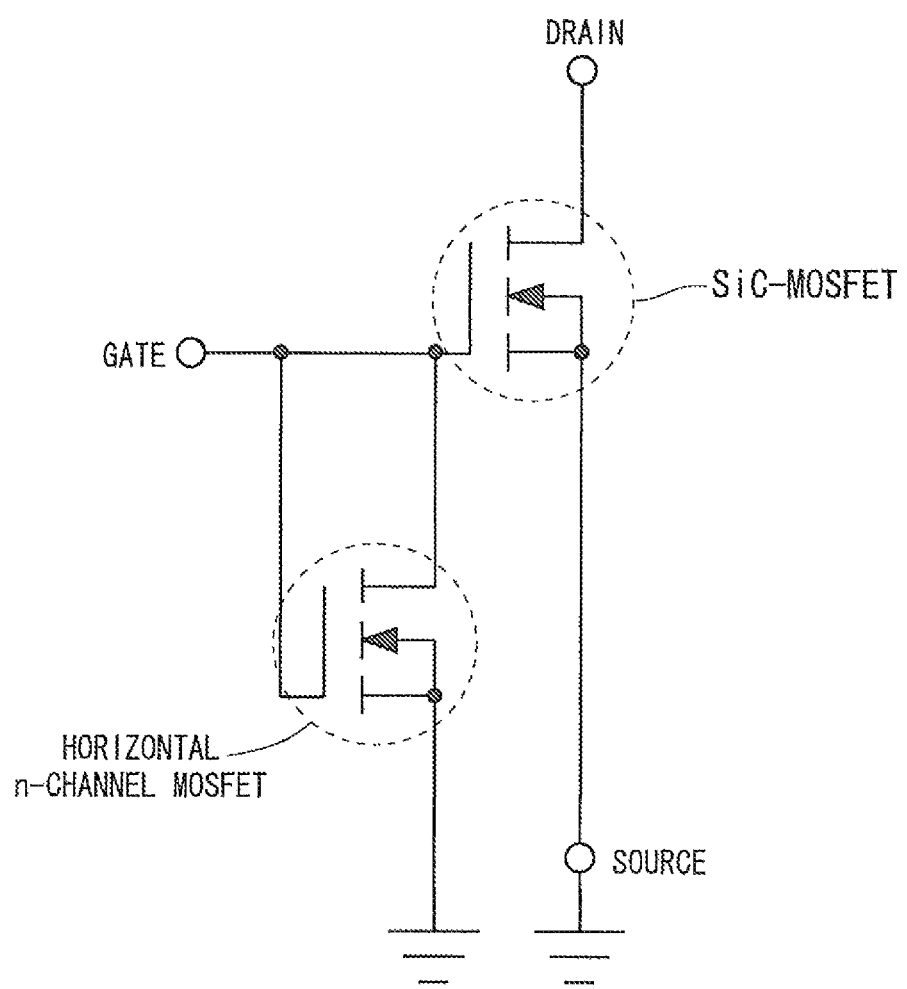

F I G . 3
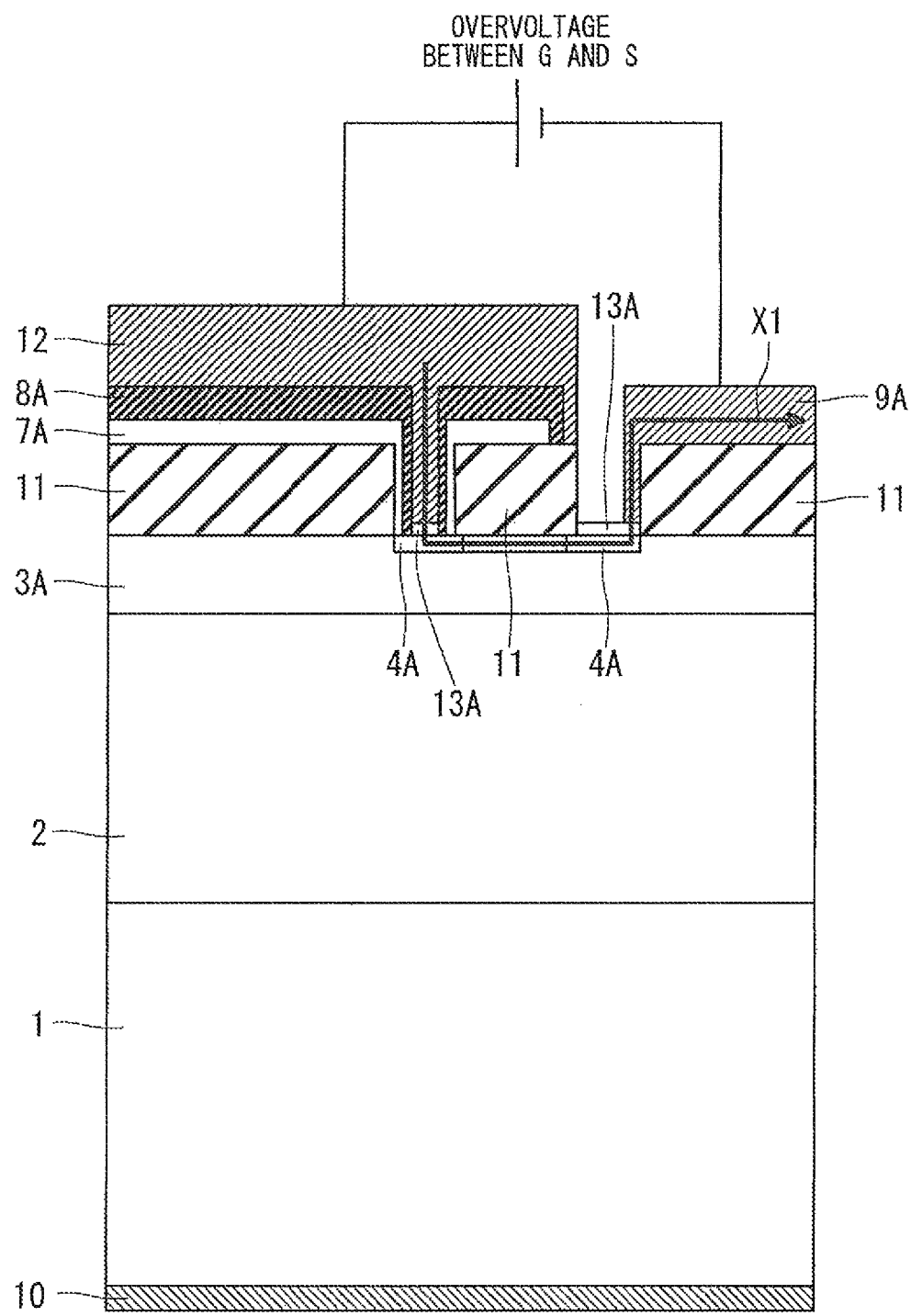

F I G . 4
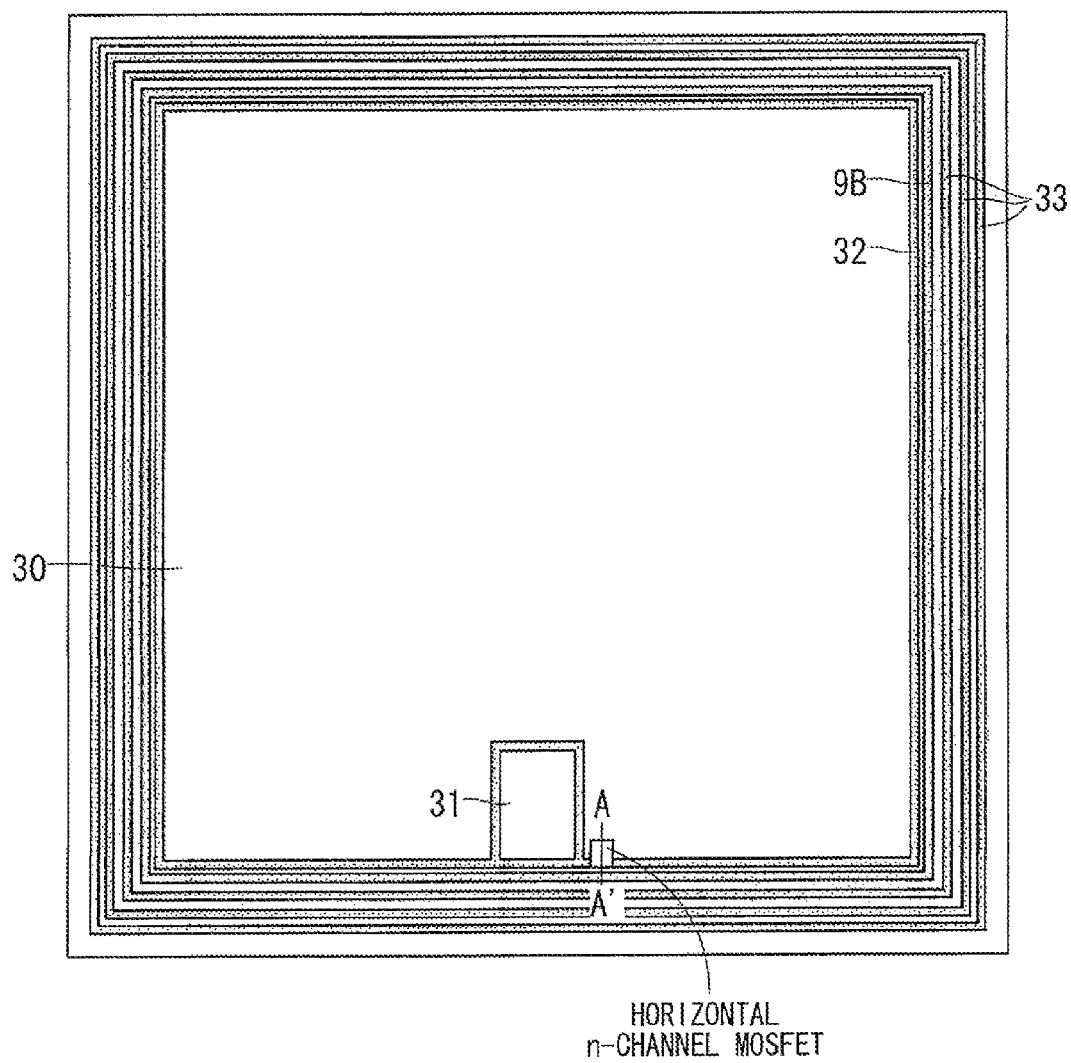

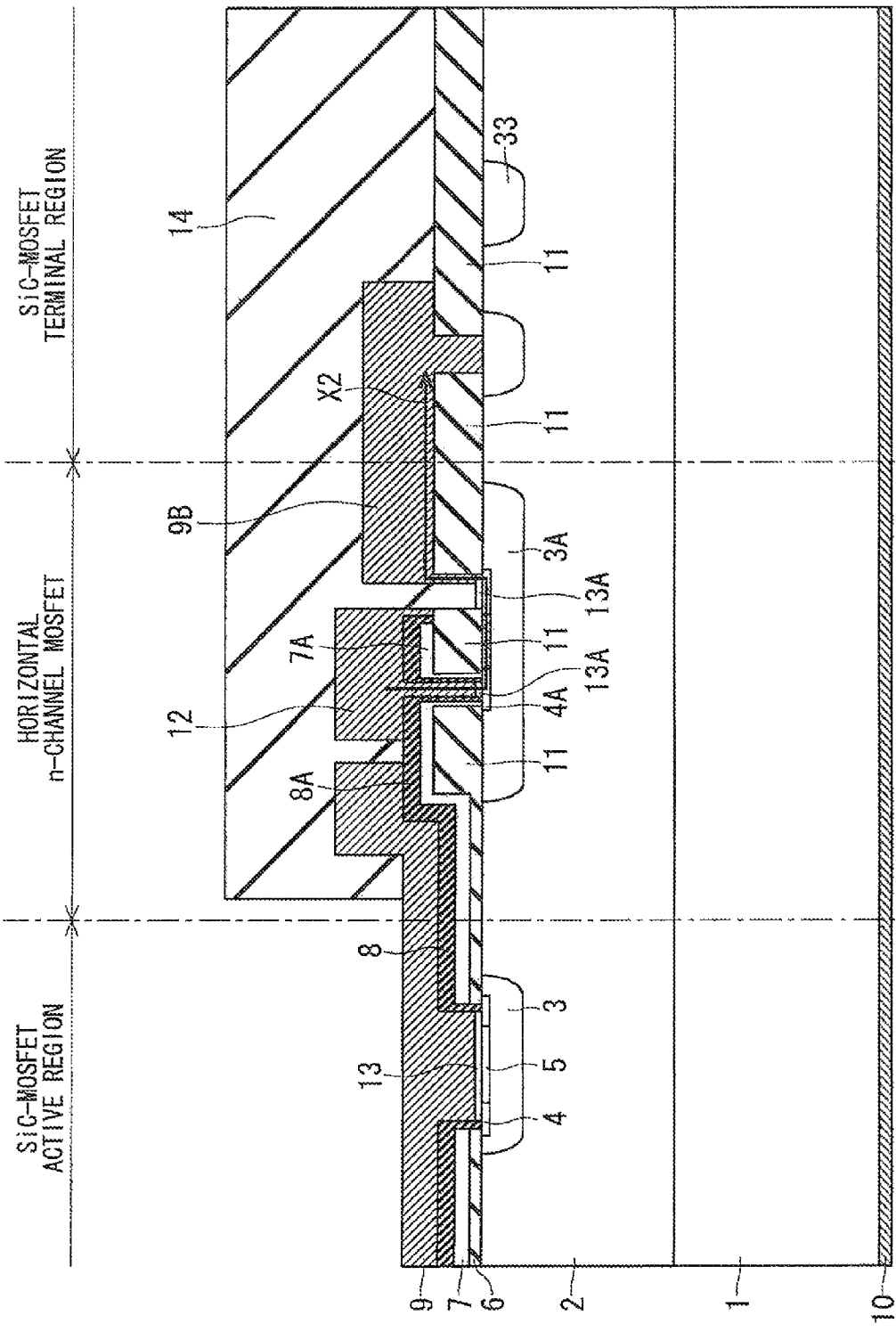
F I G. 5

F I G . 6
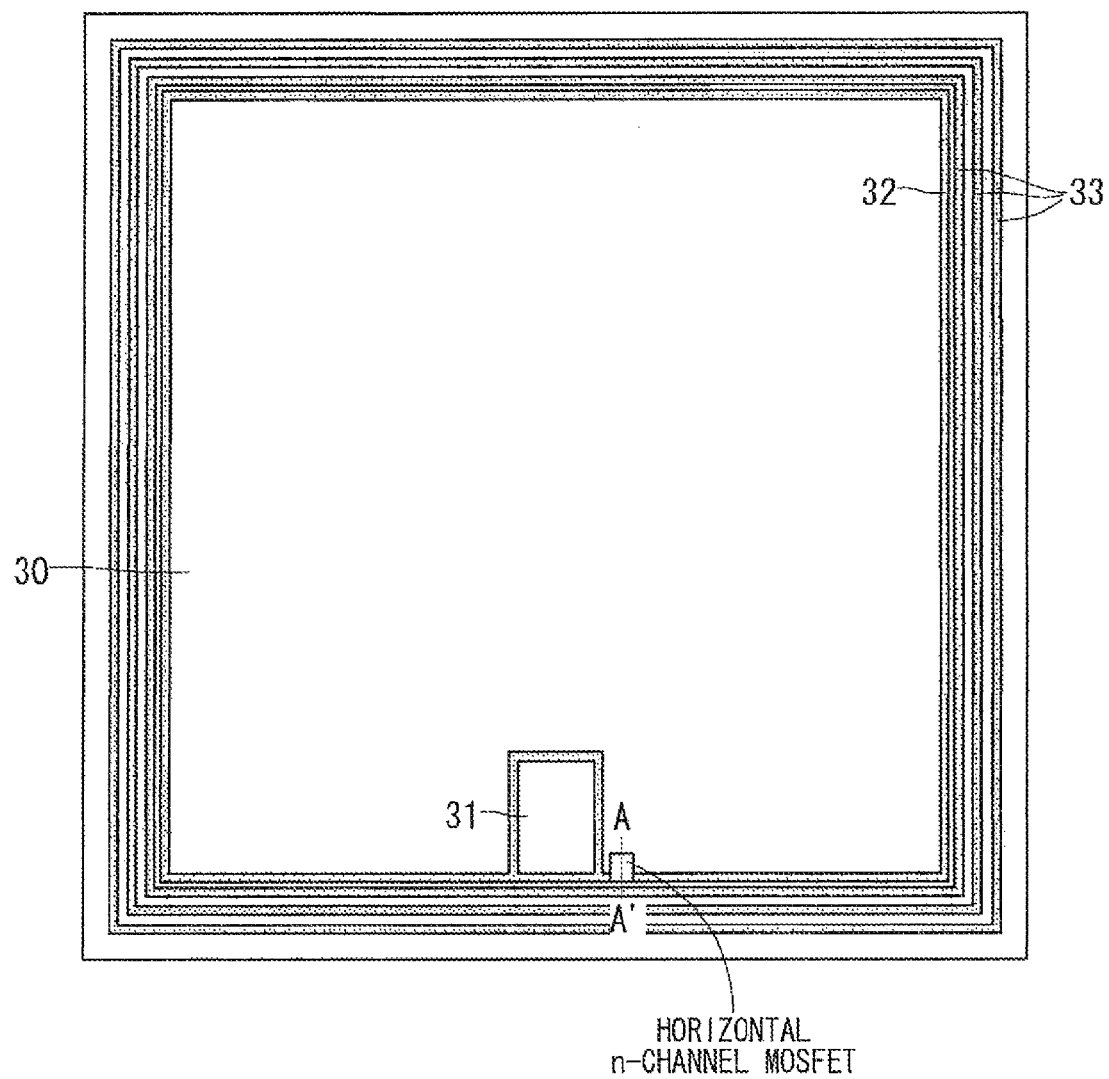

F I G. 1 1
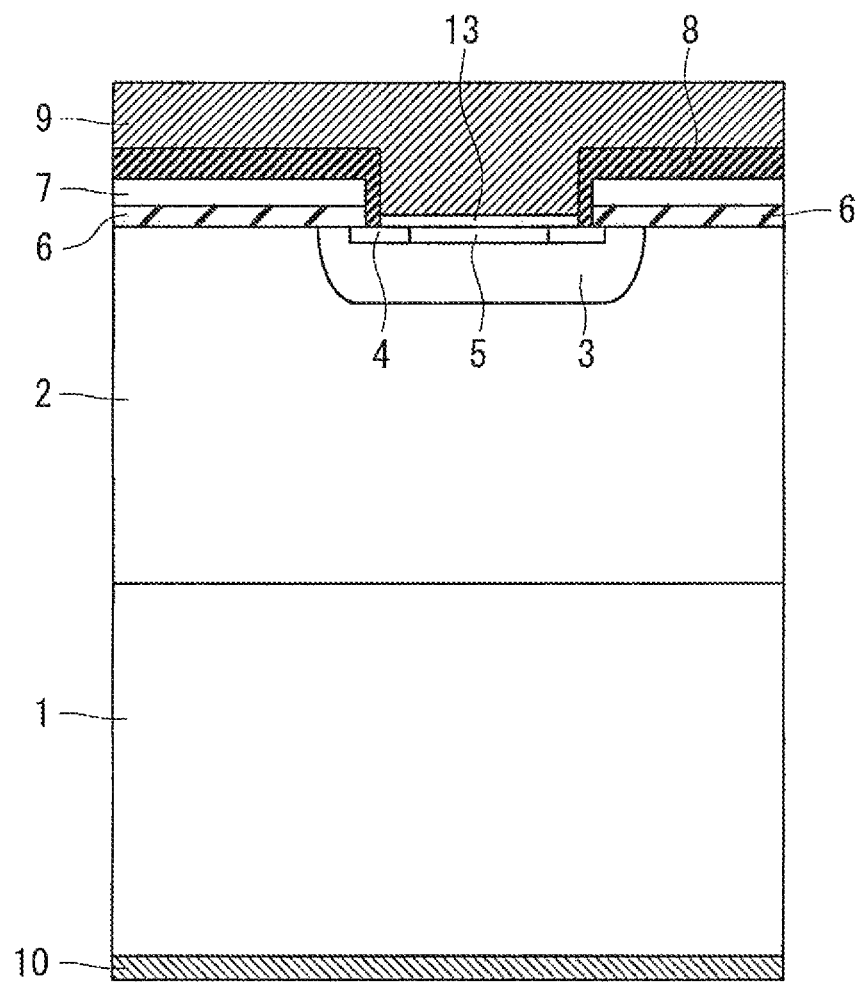

WIDE BAND GAP SEMICONDUCTOR DEVICE

BACKGROUND OF THE INVENTION

1. Field of the Invention

The present invention relates to a wide band gap semiconductor device such as a metal-oxide-semiconductor field-effect transistor (MOSFET) for forming an inverter device and the like.

2. Description of the Background Art

As an example of a wide band gap semiconductor device, a MOSFET including a SiC wafer for the material (hereinafter, referred to as a SiC-MOSFET) is configured of a plurality of unit cells disposed in the same chip.

Here, the wide band gap semiconductor is generally a semiconductor having a forbidden band width of approximately 2 eV or more. It is known as a group III-nitride represented by GaN, a group II-nitride represented by ZnO, a group II-chalcogenide represented by ZnSe, a SiC and the like.

In a case of a SiC-MOSFET compared to a MOSFET including a Si wafer (hereinafter, referred to as a Si-MOSFET), a drop in a forward voltage (on-voltage) between a drain electrode and a source electrode can be reduced more. Thus, the number of unit cells can be reduced, so that a chip size can be shrunk (see Japanese Patent Application Laid-Open No. 2012-54378).

As described above, in the SiC-MOSFET compared to a Si-MOSFET, the chip size can be shrunk more. However, on the other hand, the capacity between the gate electrode and the source electrode is reduced, and the electrostatic breakdown resistance between the gate electrode and the source electrode is decreased.

In many cases of the Si-MOSFET, as a measure against a general electrostatic breakdown, a pn junction is formed on polysilicon (Poly-Si) to contain zener diode with a use of a source process (n-type diffusion layer formation) and a P+ diffusion process (p-type diffusion layer formation) during a unit cell formation.

In the SiC-MOSFET, to activate a p-type impurity and a n-type impurity, a heat treatment at temperatures of 1500° C. or more needs to be performed in a wafer process. In general, prior to a step of forming polysilicon, ion-implantation of the p-type impurity and the n-type impurity is performed.

For this reason, to contain the zener diode in the SiC-MOSFET, during the wafer process step, the pn junction needs to be formed in a step other than the unit cell formation, and costs for processing chips increase, thereby increasing the chip costs.

SUMMARY OF THE INVENTION

It is an object of the present invention to provide a wide band gap semiconductor device capable of suppressing an electrostatic breakdown between a gate electrode and a source electrode without increasing chip costs.

A wide band gap semiconductor device according to an aspect of the present invention includes a vertical wide band gap semiconductor MOSFET including a first base layer of a second conductivity type formed on a surface layer of a first conductivity type wide gap band semiconductor layer, a first source layer of a first conductivity type formed on a surface layer of the first base layer, a gate insulating film formed on the first base layer sandwiched between the first source layer and the wide band gap semiconductor layer, a first gate electrode formed on the gate insulating film, an interlayer insulating film formed to cover the first gate electrode, a source electrode formed to cover said interlayer insulating film, said first base layer, and said first source layer, and a drain electrode formed below the wide band gap semiconductor layer, and a horizontal wide band gap semiconductor MOSFET including a second base layer formed on the surface layer of the wide band gap semiconductor layer in the same step as that of forming the first base layer, a field insulating film formed on the second base layer, a second source layer formed on a surface layer of the second base layer in the same step as that of forming the first source layer to sandwich the field insulating film, a second gate electrode being the same layer as the first gate electrode and formed at least on the field insulating film, a third gate electrode formed on one of portions of the second source layer to be electrically connected to the second gate electrode, and a second source electrode formed on the other portion of the second source layer.

According to the aspect above, when an overvoltage is applied between a gate electrode and a source electrode of a vertical wide band gap semiconductor MOSFET, a channel of a horizontal wide band gap semiconductor MOSFET is opened, so that the gate electrode generated by the overvoltage can flow toward a side of a horizontal n-channel MOSFET. Therefore, without increasing chip costs, an electrostatic breakdown on a positive side between the gate electrode and the source electrode of a SiC-MOSFET can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram of a wide band gap semiconductor device according to a preferred embodiment;

FIGS. 2 and 3 are diagrams for describing an operation of the wide band gap semiconductor device according to a preferred embodiment;

FIG. 4 is a top view showing a configuration of the wide band gap semiconductor device according to a preferred embodiment;

FIG. 5 is a schematic cross section showing a configuration of the wide band gap semiconductor device according to a preferred embodiment;

FIG. 6 is a top view showing a configuration of the wide band gap semiconductor device according to a preferred embodiment;

FIGS. 11 and 12 are diagrams for describing a process for manufacturing a wide band gap semiconductor device according to a preferred embodiment;

DESCRIPTION OF THE PREFERRED EMBODIMENTS

Hereinafter, preferred embodiments are described with reference to the attached diagrams.

Figure 17:
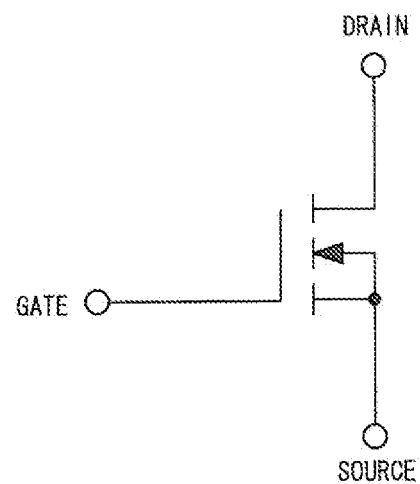
FIG. 17 is a circuit diagram of the wide band gap semiconductor device according to an underlying technology.
Figure 18:
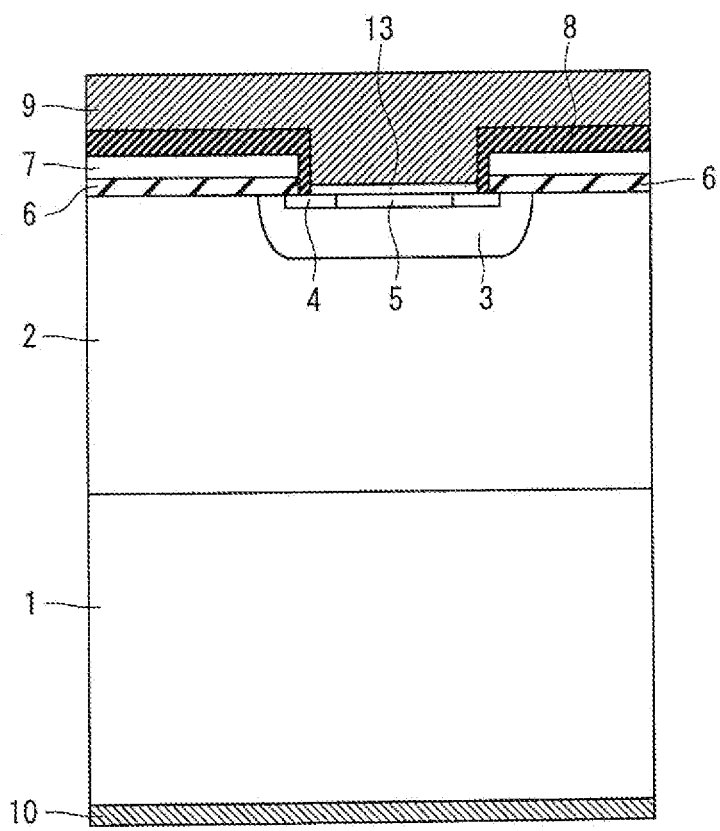
FIG. 18 is a schematic cross section of the wide band gap semiconductor device according to an underlying technology.

FIGS. 17 and 18 show, as an example of a silicon carbide (SiC) semiconductor device that is the wide band gap semiconductor device according to the underlying technology, a circuit diagram (see FIG. 17) of a vertical MOSFET including a SiC wafer for a material (hereinafter, referred to as a SiC-MOSFET) and a schematic cross section (see FIG. 18) of unit cells (active region). The semiconductor material may be, for example, GaN, as long as it is a wide band gap semiconductor.

As shown in FIG. 18, the MOSFET including the SiC wafer for the material (hereinafter, referred to as a SiC-MOSFET) is configured of a plurality of unit cells disposed in the same chip.

Particularly, as a wide band gap semiconductor layer, an $n^-$ layer 2 is formed on an n type $n^+$ buffer layer 1, and a p type p base layer 3 (first base layer) is formed on a surface layer of an $n^-$ layer 2.

Furthermore, an $n^+$ source layer 4 (first source layer) is formed on a surface layer of the p base layer 3, and a gate oxide film 6 (gate insulating film) is at least formed on the p base layer 3 sandwiched between the $n^+$ source layer 4 and the$n^-$ layer 2.

In addition, a gate polysilicon 7 (first gate electrode) is formed on the gate oxide film 6. The gate polysilicon 7 is covered with an interlayer insulating film 8.

A source electrode 9 is formed covering the interlayer insulating film 8, the p base layer 3, and the $n^+$ source layer 4.

On the other hand, a drain electrode 10 is formed below the $n^+$ buffer layer 1.

A $p^+$ layer 5 surrounded by the $n^+$ source layer 4 and an NiSi layer 13 covered with the $p^+$ layer 5 and a part of the $n^+$ source layer 4 may be further provided on the p base layer 3.

In a case of a SiC-MOSFET compared to a MOSFET including a Si wafer (hereinafter, referred to as a Si-MOSFET), a drop in a forward voltage (on-voltage) between a drain electrode and a source electrode can be reduced more. Thus, the number of unit cells can be reduced, so that the chip size can be shrunk.

However, on the other hand, the capacity between the gate electrode and the source electrode is reduced, and the electrostatic breakdown resistance between the gate electrode and the source electrode is decreased.

In many cases, as a measure against a general electrostatic breakdown, a pn junction is formed on polysilicon (Poly-Si) to contain zener diode with a use of a source process (n-type diffusion layer formation) and a P+ diffusion process (p-type diffusion layer formation) during a unit cell formation.

However, when attempting to contain the zener diode in the SiC-MOSFET, to activate a p-type impurity and a n-type impurity, a heat treatment at temperatures of 1500° C. or more needs to be performed in a wafer process. In general, prior to a step of forming polysilicon, ion-implantation of the p-type impurity and the n-type impurity is performed.

For this reason, to contain the zener diode in the SiC-MOSFET, during the wafer process step, the pn junction needs to be formed in a step other than the unit cell formation, and costs for processing chips increase, thereby increasing the chip costs.

Preferred embodiments as described below are related to a wide band gap semiconductor device capable of solving the problems as mentioned above.

<First Preferred Embodiment>
<Configuration>

FIG. 1 is a circuit diagram of a wide band gap semiconductor device in which a horizontal n-channel MOSFET is contained between a gate electrode of a SiC-MOSFET and a source electrode thereof.

As shown in FIG. 1, a horizontal n-channel MOSFET is contained in the SiC-MOSFET. In other words, a drain electrode and a gate electrode of the horizontal n-channel MOSFET are connected to the gate electrode side of the SiC-MOSFET.

With this configuration, when a positive overvoltage is applied between the gate electrode and the source electrode of the SiC-MOSFET, the current flows toward the horizontal n-channel MOSFET side, so that it is possible to suppress an overvoltage breakdown such as an electrostatic breakdown between the gate electrode and the source electrode of the SiC-MOSFET.

Figure 2:
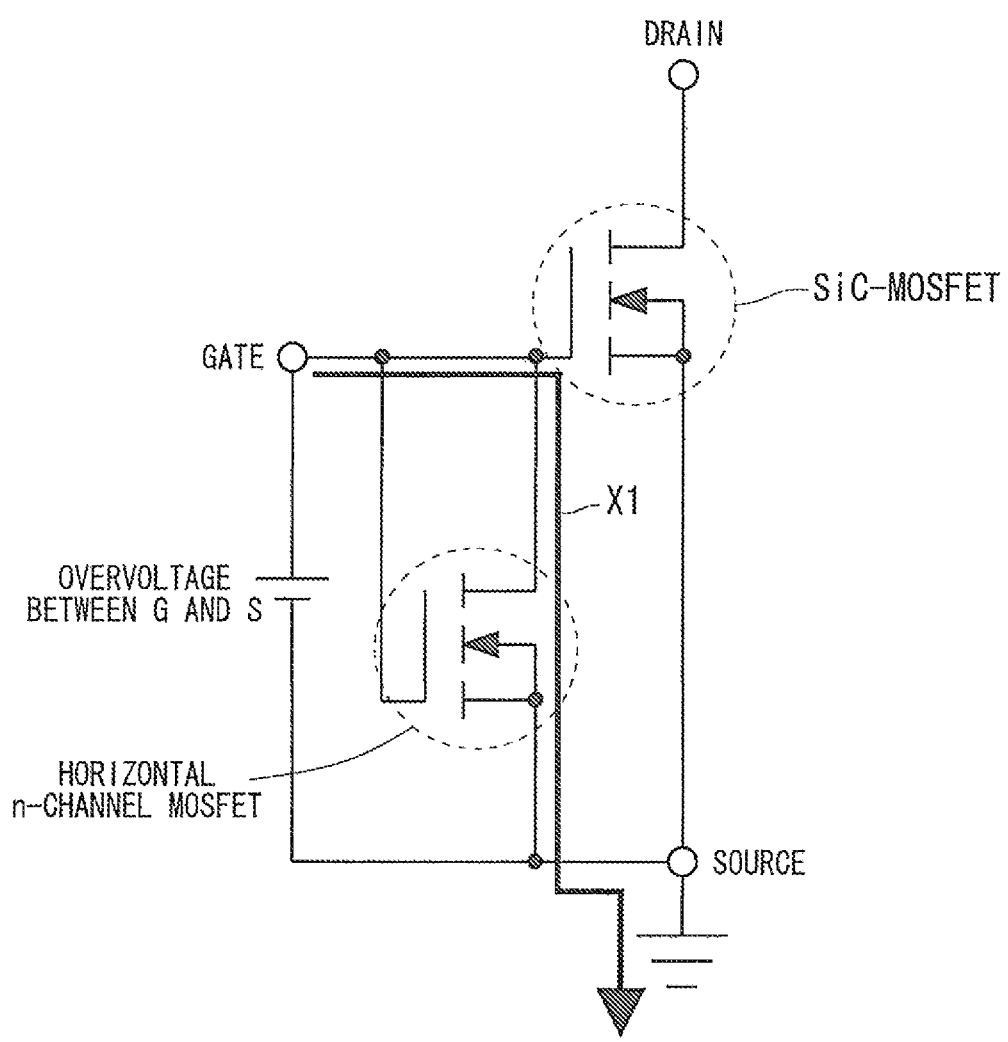

FIGS. 2 and 3 show an operation of the horizontal n-channel MOSFET when the overvoltage is applied between the gate electrode and the source electrode of the SiC-MOSFET.

First, a structure of the horizontal n-channel MOSFET is described with reference to FIG. 3. The structure shown in FIG. 3 is described with reference to the relationship with a structure shown in FIG. 18.

As shown in FIG. 3, as the wide band gap semiconductor layer, the$n^-$ layer 2 is formed on the n type $n^+$ buffer layer 1, and a p type p base layer 3A (second base layer) is formed on the surface layer of the$n^-$ layer 2. The p base layer 3A is formed in the same step as that of forming the p base layer 3.

Furthermore, a field insulating film 11 is formed on the p base layer 3A. A $n^+$ source layer 4A (second source layer) sandwiching the field insulating film 11 is formed on the surface layer of the p base layer 3A. The $n^+$ source layer 4A is formed in the same step as that of forming the $n^+$ source layer 4. The gate oxide film 6 and the field insulating film 11 are partially etched, and an n-type ion is implanted into the p base layer 3 and the p base layer 3A which are exposed, thereby forming the $n^+$ source layer 4. An NiSi layer 13A is formed on the $n^+$ source layer 4A.

A gate polysilicon 7A (second gate electrode) is formed on the field insulating film 11. The gate polysilicon 7A is the same layer as the gate polysilicon 7, and it is etched correspondingly to the gate oxide film 6 and the field insulating film 11. Here, "the same layer" is referred to as a successive layer being a pattern formed in the same process.

The gate polysilicon 7A is covered with an interlayer insulating film 8A. The interlayer insulating film 8A is the same layer as the interlayer insulating film 8, and it is etched correspondingly to the gate oxide film 6 and the field insulating film 11.

A gate electrode 12 (third gate electrode) is formed to cover the interlayer insulating film 8A and one of portions of the n⁺ source layer 4A. The gate polysilicon 7A and the interlayer insulating film 8A as mentioned above are formed on a side surface of the field insulating film 11 on the side of the gate electrode 12.

In addition, a source electrode 9A (second source electrode) is formed to partially cover the interlayer insulating film 8A and the other portion of the n⁺ source layer 4A.

On the other hand, the drain electrode 10 is formed below the n⁺ buffer layer 1.

<Effects>

When an overvoltage is applied between the gate electrode and the source electrode of the SiC-MOSFET, a voltage is also applied between the gate electrode and the source electrode of the horizontal n-channel MOSFET contained in the SiC-MOSFET. Thus, the n-channel is formed in the horizontal n-channel MOSFET.

Since the n-channel is formed in the horizontal n-channel MOSFET, a gate current generated by the overvoltage between the gate electrode and the source electrode of the SiC-MOSFET flows toward the horizontal n-channel MOSFET (see X1 in FIGS. 2 and 3). For this reason, the gate current as mentioned above can be suppressed to flow between the gate electrode and the source electrode of the SiC-MOSFET, and thus a breakdown caused by the overvoltage between the gate electrode and the source electrode can be prevented.

According to the present preferred embodiment, the wide band gap semiconductor device includes a vertical wide band gap semiconductor MOSFET and a horizontal wide band gap semiconductor MOSFET.

The vertical wide band gap semiconductor MOSFET includes the first base layer of the second conductivity type (p base layer 3) formed on a surface layer of a first conductivity type wide gap band semiconductor layer (n⁻ layer 2), a first source layer of a first conductivity type (n⁺ source layer 4) formed on a surface layer of the p base layer 3, the gate insulating film (gate oxide film 6) formed on the p base layer 3 sandwiched between the n⁺ source layer 4 and then⁻ layer 2, the first gate electrode (gate polysilicon 7) formed on the gate oxide film 6, the interlayer insulating film 8 formed to cover the gate polysilicon 7, the source electrode 9 formed to cover the interlayer insulating film 8, the p base layer 3 and the n⁺ source layer 4, and the drain electrode 10 formed below the n⁻ layer 2.

The horizontal wide band gap semiconductor MOSFET includes the second base layer (p base layer 3A) formed on a surface layer of then⁻ layer 2 in the same step as that of forming the p base layer 3, the field insulating film 11 formed on the p base layer 3A, the second source layer (n⁺ source layer 4A) formed on a surface layer of the p base layer 3A sandwiching the field insulating film 11 and formed in the same step as that of forming the n⁺ source layer 4, the second gate electrode (gate polysilicon 7A) being the same layer as the gate polysilicon 7 and at least formed on the field insulating film 11, the third gate electrode (gate electrode 12) electrically connected to the gate polysilicon 7A and formed on one of portions of the n⁺ source layer 4A, and the second source electrode (source electrode 9A) formed on the other portion of the n⁺ source layer 4A.

According to this configuration, when a positive overvoltage is applied between the gate electrode and the source electrode of the SiC-MOSFET (vertical wide band gap semiconductor MOSFET), a channel of the horizontal n-channel MOSFET (horizontal wide band gap semiconductor MOSFET) is opened and the gate current caused by the overvoltage is flowed toward the horizontal n-channel MOSFET side. Thus, an electrostatic breakdown on the positive side between the gate electrode and the source electrode of the SiC-MOSFET can be suppressed.

Moreover, according to the present preferred embodiment, the horizontal n-channel MOSFET (horizontal wide band gap semiconductor MOSFET) has a threshold voltage of 25 V or more between the gate polysilicon 7A and the source electrode 9A.

A maximum voltage rating between a gate electrode and a source electrode of a general SiC-MOSFET is 20 V. The threshold voltage between the gate electrode and the source electrode of the horizontal n-channel MOSFET is set to 25 V or more, so that when a normal operation is performed within the maximum voltage rating which is a voltage of 20 V or less between the gate electrode and the source electrode, the horizontal n-channel MOSFET has no effects on the operation of the SiC-MOSFET.

<Second Preferred Embodiment>

<Configuration>

In the wide band gap semiconductor device shown in the first preferred embodiment, the threshold voltage (hereinafter, referred to as a VGSth) between the gate electrode and the source electrode of the contained horizontal n-channel MOSFET is set to 25 V or more, and thus the horizontal n-channel MOSFET can be prevented to have effects on a normal operation of the SiC-MOSFET.

The maximum voltage rating between a gate electrode and a source electrode of a general SiC-MOSFET is 20 V. Thus, the VGSth of the contained horizontal n-channel MOSFET is set to 25 V or more, not allowing the horizontal n-channel MOSFET to operate during an operation of a normal SiC-MOSFET having the voltage of 20 V or less between the gate electrode and the source electrode.

Furthermore, the VGSth of the horizontal n-channel MOSFET is set to 25 V or more to increase a drop in a forward voltage (on-voltage) of the horizontal n-channel MOSFET. Thus, the gate current generated by the gate overvoltage can be consumed by the horizontal n-channel MOSFET. Consequently, it is unnecessary to add a resistance between the horizontal n-channel MOSFET and the SiC-MOSFET for consuming the gate current.

<Effects>

According to the present preferred embodiment, the second source electrode is the same layer as the first source electrode.

According to this configuration, the source electrode of the contained horizontal n-channel MOSFET is connected to the source electrode of the SiC-MOSFET, so that a ground (GND) wiring is unnecessary in a terminal connecting region of the SiC-MOSFET, whereby an increase in an invalid area of a chip can be suppressed. Therefore, without increasing chip costs, the horizontal n-channel MOSFET can be contained.

<Third Preferred Embodiment>

<Configuration>

FIG. 4 is a top view showing a configuration of the wide band gap semiconductor device according to the present preferred embodiment. FIG. 5 is a schematic cross section showing a configuration of the wide band gap semiconductor device according to the present preferred embodiment.

The present preferred embodiment describes a case where the source electrode of the contained horizontal n-channel MOSFET is connected to a ground (hereinafter, referred to as GND) wiring 9B formed in the terminal region of the SiC-MOSFET.

As shown in FIG. 4, a gate wiring 32, the GND wiring 9B, and field limiting rings (hereinafter, referred to as FLRs) 33 are formed to surround an active region having a plurality of unit cells formed in. A source pad 30 is disposed so as to cover the active region, and a gate pad 31 is disposed along the gate wiring 32.

The horizontal n-channel MOSFET contained in the SiC-MOSFET is disposed on the boundary between the active region and the terminal region.

FIG. 5 shows a cross section taken along an A-A' line as shown in FIG. 4.

In FIG. 5, the GND wiring 9B of the terminal region is used as the source electrode of the horizontal n-channel MOSFET. The GND wiring 9B and the horizontal n-channel MOSFET are covered with a terminal region protective film 14.

When the overvoltage is applied between the gate electrode and the source electrode of the SiC-MOSFET, the voltage is also applied between the gate electrode and the source electrode of the contained horizontal n-channel MOSFET. Therefore, the n-channel is formed in the horizontal n-channel MOSFET.

Since the n-channel is formed in the horizontal n-channel MOSFET, the gate current generated by the overvoltage between the gate electrode and the source electrode of the SiC-MOSFET flows toward the horizontal n-channel MOSFET (see X2 in FIG. 5).

The source electrode of the contained horizontal n-channel MOSFET is used as the GND wiring 9B in the terminal region of the SiC-MOSFET, so that without any effects on an active operation (unit cell operation) of the SiC-MOSFET, the gate current generated by the overvoltage applied between the gate electrode and the source electrode can be dissipated to the GND wiring.

<Effects>

According to the present preferred embodiment, the second source electrode is the ground wiring in the terminal region formed to surround the vertical wide band gap semiconductor MOSFET.

According to this configuration, the source electrode of the contained horizontal n-channel MOSFET is connected to the ground (GND) wiring in the terminal connecting region of the SiC-MOSFET, so that without any effects on the operation of the active region of the SiC-MOSFET, the gate current generated by the overvoltage applied between the gate electrode and the source electrode of the SiC-MOSFET can be dissipated to the GND wiring.

<Fourth Preferred Embodiment>
<Configuration>

Figure 7:
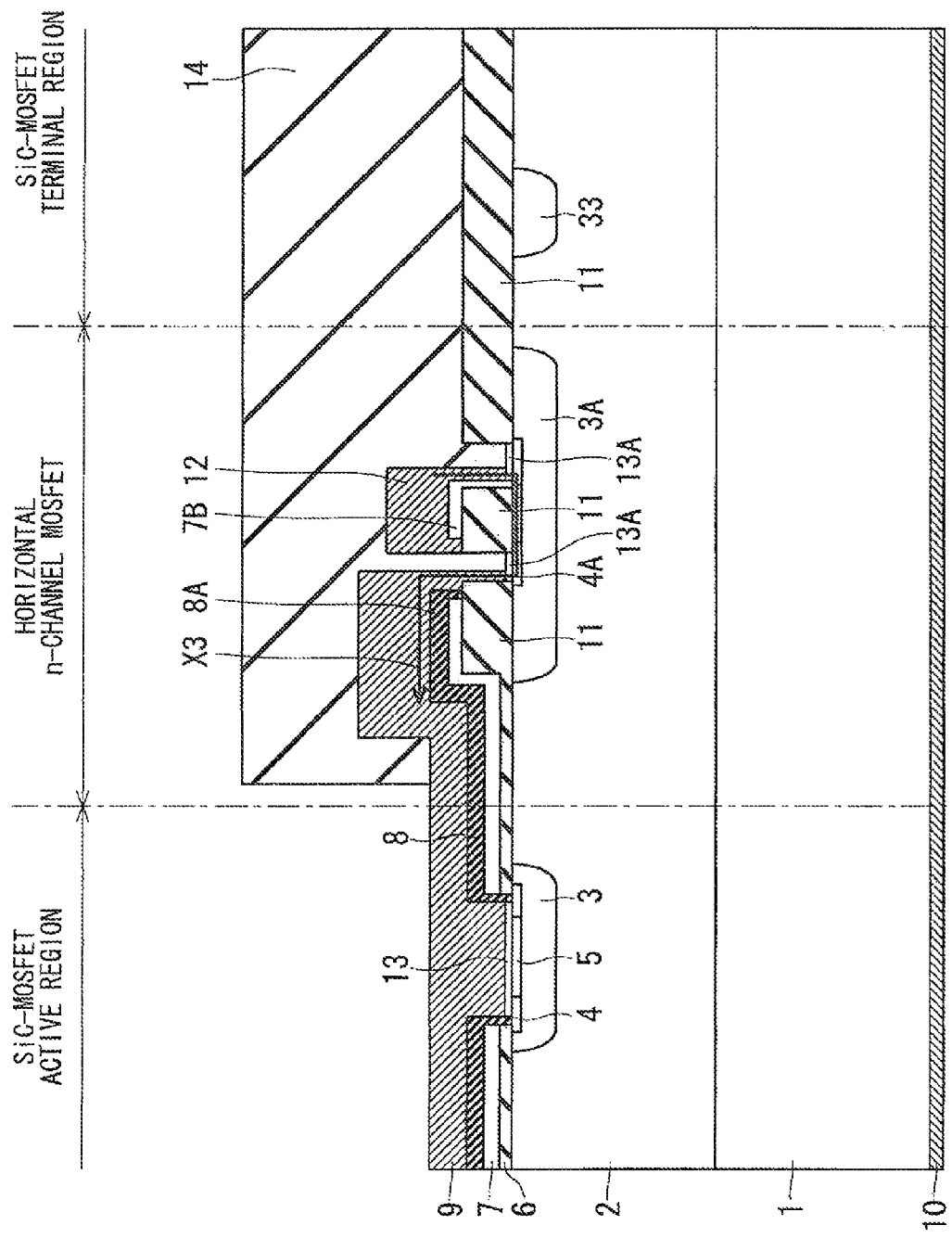
FIG. 7 is a schematic cross section showing a configuration of the wide band gap semiconductor device according to a preferred embodiment.

FIG. 6 is a top view showing a configuration of the wide band gap semiconductor device according to the present preferred embodiment. FIG. 7 is a schematic cross section showing a configuration of the wide band gap semiconductor device according to the present preferred embodiment.

The present preferred embodiment describes a case where the source electrode of the contained horizontal n-channel MOSFET is the same layer as the source electrode of the SiC-MOSFET.

As shown in FIG. 6, the gate wiring 32 and the FLRs 33 are formed to surround the active region having the plurality of unit cells formed in. The source pad 30 is disposed so as to cover the active region, and the gate pad 31 is disposed along the gate wiring 32.

The horizontal n-channel MOSFET contained in the SiC-MOSFET is disposed on the boundary between the active region and the terminal region.

FIG. 7 shows a cross section taken along an A-A' line as shown in FIG. 6.

In FIG. 7, the source electrode of the horizontal n-channel MOSFET is the source electrode 9 of the SiC-MOSFET. Then, the gate electrode 12 is formed to cover one of portions of the $n^+$ source layer 4A (at the opposite side of FIG. 5). The gate polysilicon 7B as mentioned above is formed on the side surface of the field insulating film 11 on the side of the gate electrode 12.

In addition, the source electrode 9 is formed so as to partially cover the interlayer insulating film 8A and the other portion of the $n^+$ source layer 4A. The gate polysilicon 7B of the horizontal n-channel MOSFET is not covered with the interlayer insulating film 8A. The horizontal n-channel MOSFET is covered with the terminal region protective film 14.

When the overvoltage is applied between the gate electrode and the source electrode of the SiC-MOSFET, the voltage is also applied between the gate electrode and the source electrode of the contained horizontal n-channel MOSFET. Therefore, the n-channel is formed in the horizontal n-channel MOSFET.

Since the n-channel is formed in the horizontal n-channel MOSFET, the gate current generated by the overvoltage between the gate electrode and the source electrode of the SiC-MOSFET flows toward the horizontal n-channel MOSFET (see X3 in FIG. 7).

<Effects>

The source electrode of the contained horizontal n-channel MOSFET is set as the source electrode of the SiC-MOSFET, so that it is unnecessary to newly form a source electrode of the horizontal n-channel MOSFET, whereby an increase in an invalid area of the SiC-MOSFET chip can be suppressed. An increase in the invalid area can be suppressed, whereby the horizontal n-channel MOSFET can be contained without increasing an area of the chip, and an increase of the chip costs can be suppressed.

<Fifth Preferred Embodiment>
<Configuration>

Figure 8:
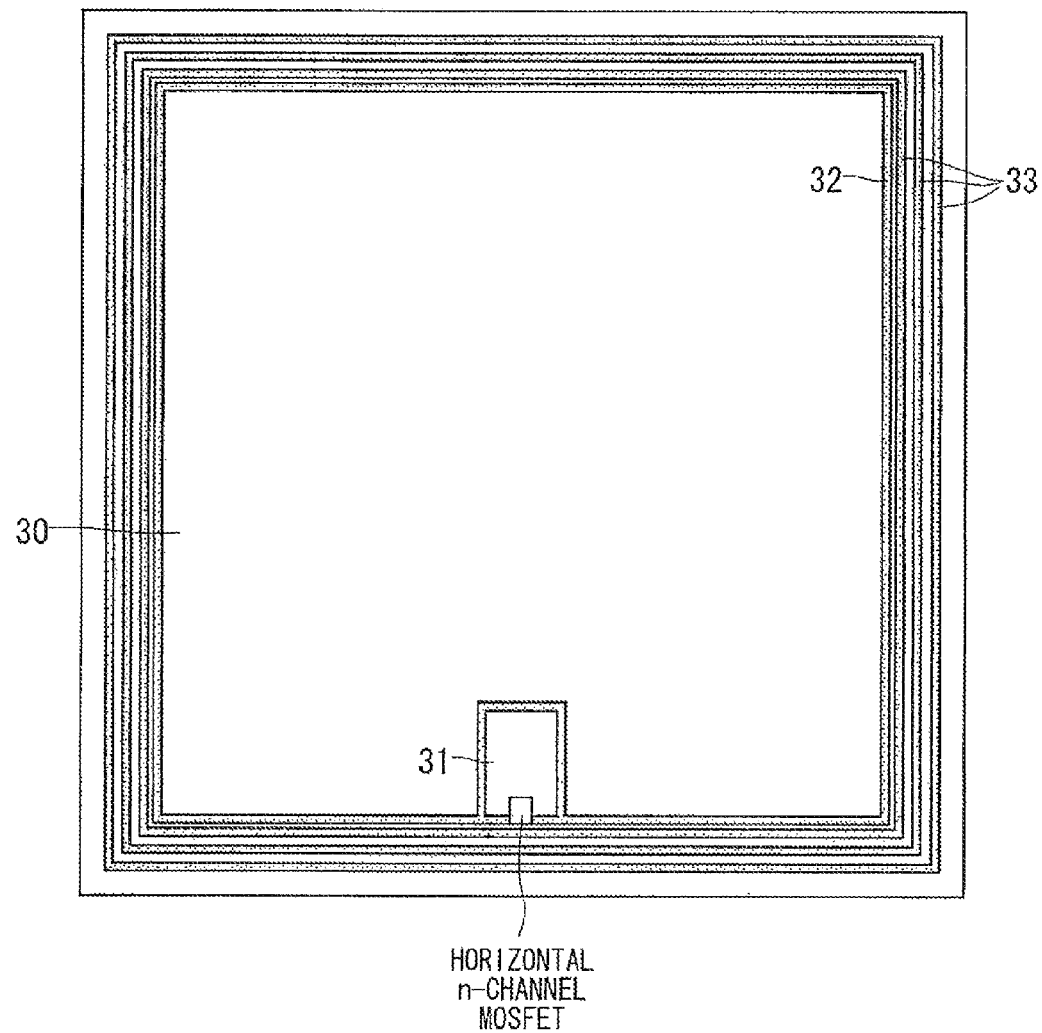
FIG. 8 is a top view showing a configuration of the wide band gap semiconductor device according to a preferred embodiment.

FIG. 8 is a top view showing a configuration of the wide band gap semiconductor device according to the present preferred embodiment.

The present preferred embodiment describes a case where the contained horizontal n-channel MOSFET is disposed within a wire bonding pad region of the gate electrode of the SiC-MOSFET.

As shown in FIG. 8, the gate wiring 32 and the FLRs 33 are formed to surround the active region having the plurality of unit cells formed in. The source pad 30 is formed so as to cover the active region, and the gate pad 31 is disposed along the gate wiring 32.

The horizontal n-channel MOSFET contained in the SiC-MOSFET is disposed on the boundary between the active region and the terminal region, and disposed in the gate pad 31.

<Effects>

In this manner, the horizontal n-channel MOSFET is disposed within the wire bonding pad region of the gate electrode of the SiC-MOSFET, so that it is possible to contain the horizontal n-channel MOSFET without increasing the invalid region of the SiC-MOSFET chip and to suppress the increase of the chip costs. Furthermore, the increase in the invalid areas of the chip can be prevented.

Figure 9:
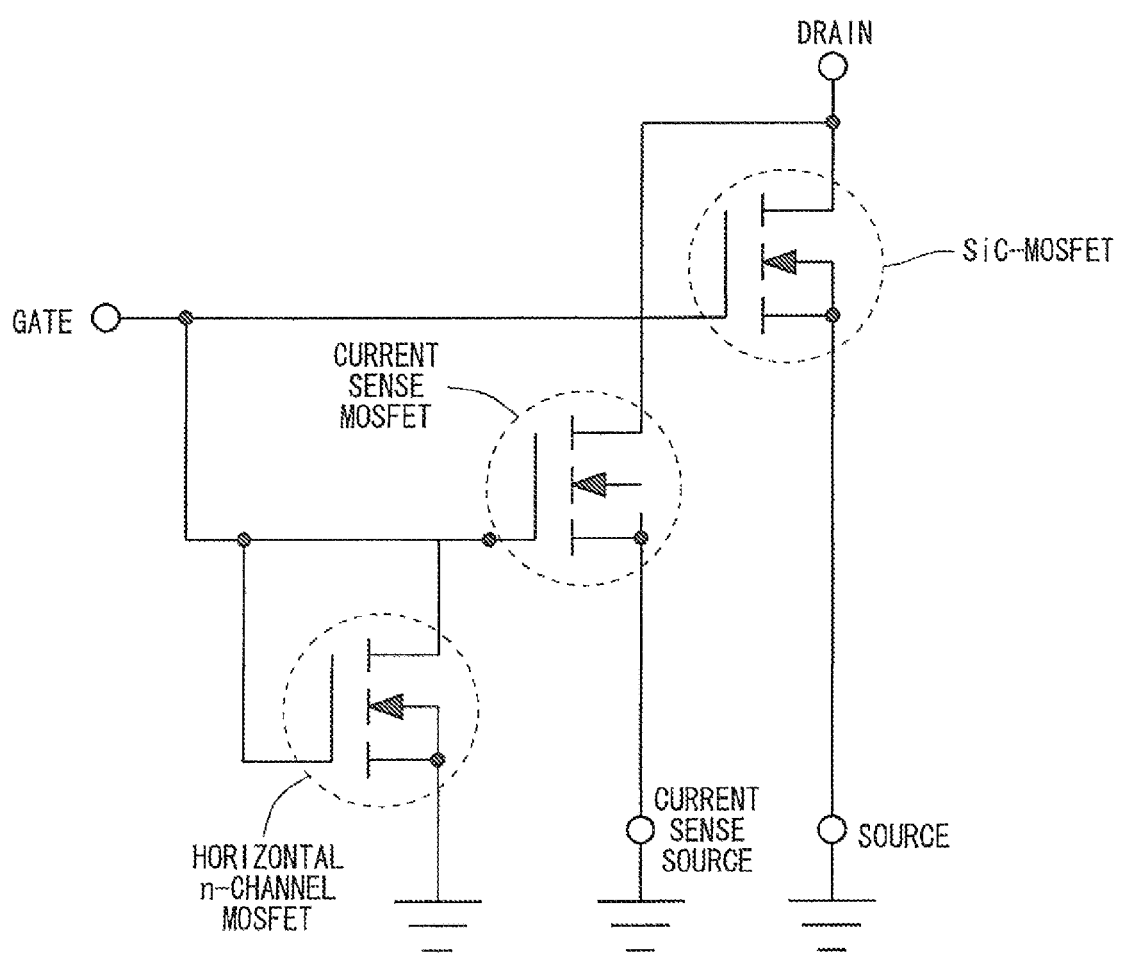
FIG. 9 is a circuit diagram of the wide band gap semiconductor device according to a preferred embodiment.

<Sixth Preferred Embodiment>
<Configuration>
FIG. 9 shows a circuit diagram of the wide band gap semiconductor device in which the horizontal n-channel MOSFET is contained between the gate electrode and the source electrode of a current sense MOSFET. The current sense MOSFET is contained in the SiC-MOSFET.

The current sense is contained in an IGBT chip, a MOSFET chip, and the like which are used for an intelligent power module (hereinafter, referred to as an IPM). The current sense is used for protection and detection when an overcurrent flows into a chip.

In general, the MOSFET functioning as the current sense has an area of an active region in which approximately one ten-thousandth of the current passing through the active region of the IGBT chip, the MOSFET chip, or the like can be passed. The current sense has a small area of the active region and a small capacity between the gate electrode and the source electrode, so that the electrostatic breakdown resistance is low between the gate electrode and the source electrode.

As shown in FIG. 9, the horizontal n-channel MOSFET is contained in the current sense MOSFET. In other words, the drain electrode and the gate electrode of the horizontal n-channel MOSFET are connected to the gate electrode side of the current sense MOSFET.

<Effects>
With this configuration, when the positive overvoltage is applied between the gate electrode and the source electrode of the current sense MOSFET, the current flows toward the horizontal n-channel MOSFET side, so that it is possible to suppress an overvoltage breakdown such as an electrostatic breakdown between the gate electrode and the source electrode of the current sense MOSFET. Moreover, the increase in the invalid area of the chip can be prevented.

<Seventh Preferred Embodiment>
<Configuration>
In the wide band gap semiconductor device as shown in the sixth preferred embodiment, the threshold voltage (VGSth) between the gate electrode and the source electrode of the contained horizontal n-channel MOSFET is set to 25 V or more, and thus the horizontal n-channel MOSFET can be prevented to have effects on the normal operation of the current sense MOSFET.

The maximum voltage rating between a gate electrode and a source electrode of a general current sense MOSFET is 20 V. Thus, the VGSth of the contained horizontal n-channel MOSFET is set to 25 V or more, not allowing the horizontal n-channel MOSFET to operate during an operation of a normal current sense MOSFET having the voltage of 20 V or less between the gate electrode and the source electrode.

Furthermore, the VGSth of the horizontal n-channel MOSFET is set to 25 V or more to increase a drop in a forward voltage (on-voltage) of the horizontal n-channel MOSFET. Thus, the gate current generated by the gate overvoltage can be consumed by the horizontal n-channel MOSFET. Consequently, it is unnecessary to add a resistance between the horizontal n-channel MOSFET and the current sense MOSFET for consuming the gate current.

Figure 10:
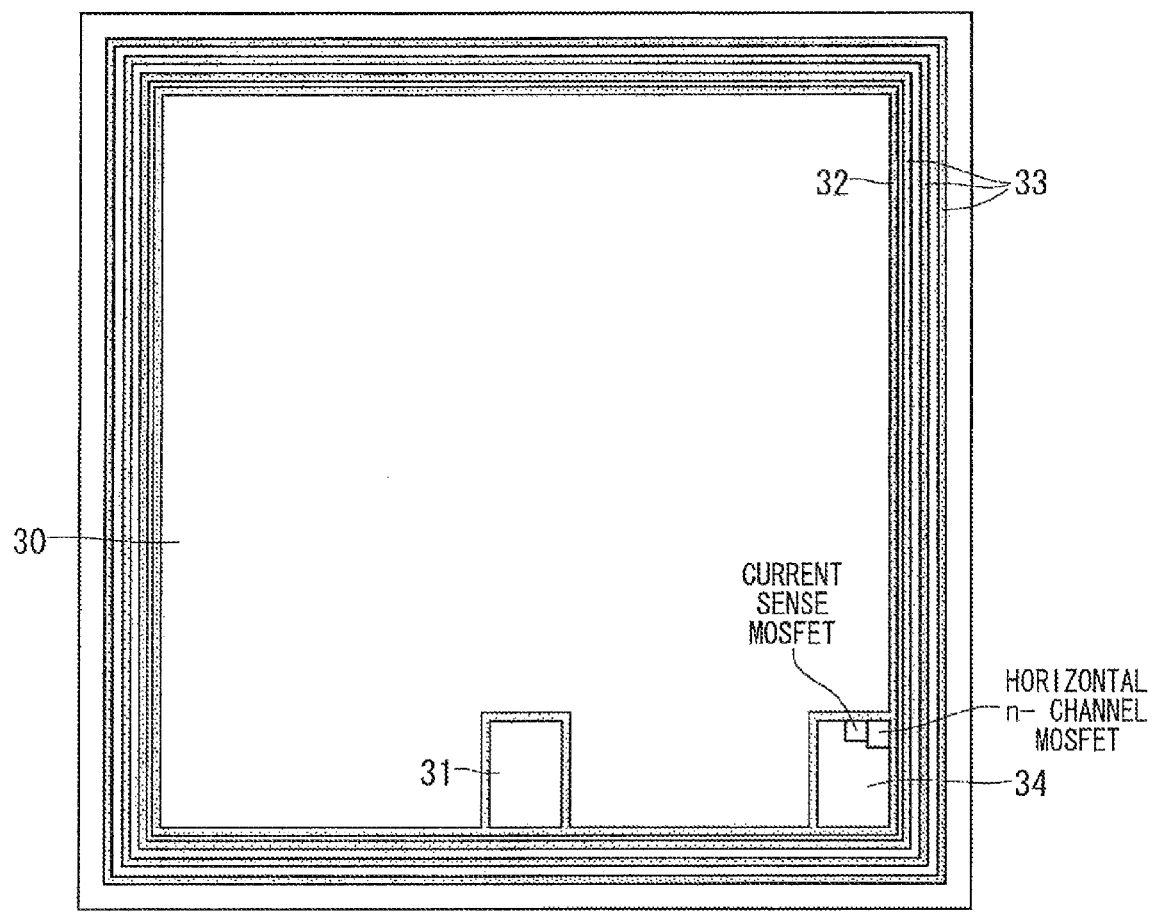
FIG. 10 is a top view showing a configuration of the wide band gap semiconductor device according to a preferred embodiment.

<Eighth Preferred Embodiment>
<Configuration>
FIG. 10 is a top view showing a configuration of the wide band gap semiconductor device according to the present preferred embodiment.

The present preferred embodiment describes a case where the contained horizontal n-channel MOSFET is disposed within a wire bonding pad region of the current sense MOSFET.

As shown in FIG. 10, the gate wiring 32 and the FLRs 33 are formed to surround the active region having the plurality of unit cells formed in. The source pad 30 is formed so as to cover the active region. The gate pad 31 and a current sense pad 34 are disposed along the gate wiring 32.

The horizontal n-channel MOSFET contained in the current sense MOSFET is disposed in the current sense pad 34.

<Effects>
In this manner, the horizontal n-channel MOSFET is disposed within the wire bonding pad region of the current sense MOSFET, so that it is possible to contain the horizontal n-channel MOSFET without increasing the invalid region of the SiC-MOSFET chip and to suppress the increase of chip costs.

Figure 12:
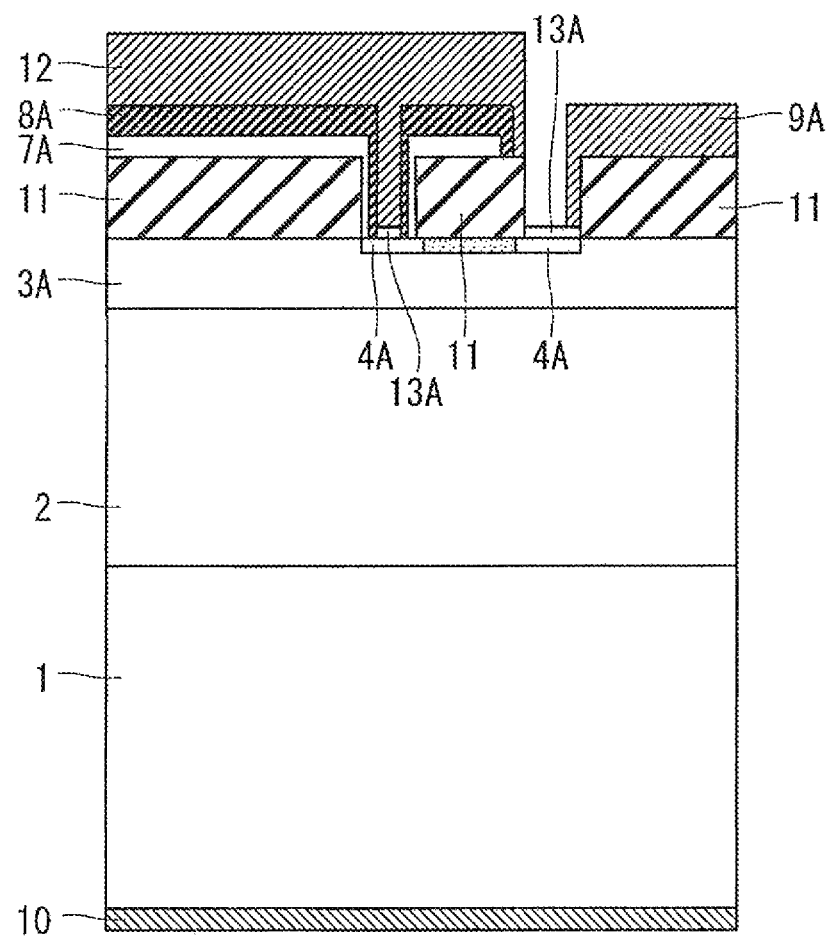

<Ninth Preferred Embodiment>
<Configuration>
FIGS. 11 and 12 show a case where the field insulating film 11 of the contained horizontal n-channel MOSFET is simultaneously formed in a field oxidation process of the SiC-MOSFET in the second preferred embodiment and the seventh preferred embodiment.

In general, an oxide film formed in a field oxidation process in a peripheral region of the SiC-MOSFET has a greater film thickness than that of the gate oxide film 6 in the active region (unit cell). The oxide film formed in the field oxidation process is used as a gate insulating film of the horizontal n-channel MOSFET, which allows the gate insulating film of the horizontal n-channel MOSFET to be formed without increasing the number of processes. Furthermore, since the oxide film has the great film thickness, it is possible to set the VGSth of the horizontal n-channel MOSFET higher than the VGSth of the SiC-MOSFET.

For this reason, without increasing the chip costs, it is possible to contain the horizontal n-channel MOSFET having no effects on the normal operation of the SiC-MOSFET.

<Effects>
According to the present preferred embodiment, the field insulating film 11 is formed in a step of forming the peripheral region surrounding the vertical wide band gap semiconductor MOSFET.

In general, an oxide film formed in a field oxidation process of the SiC-MOSFET has a greater thickness than that of the active region of the SiC-MOSFET. The oxide film in the field oxidation process is used as the gate oxide film of the horizontal n-channel MOSFET. Therefore, without increasing the number of processes, the threshold voltage between the gate electrode and the source electrode of the horizontal n-channel MOSFET can be set higher than that between the gate electrode and the source electrode of the active region of the SiC-MOSFET.

<Tenth Preferred Embodiment>
<Configuration>
The present preferred embodiment describes a case where a surface layer of the wide band gap semiconductor layer is etched to form a recessed part 20, and the $n^+$ source layer 4A of the horizontal n-channel MOSFET is formed inside the recessed part 20 in the second preferred embodiment and the seventh preferred embodiment.

Figure 13:
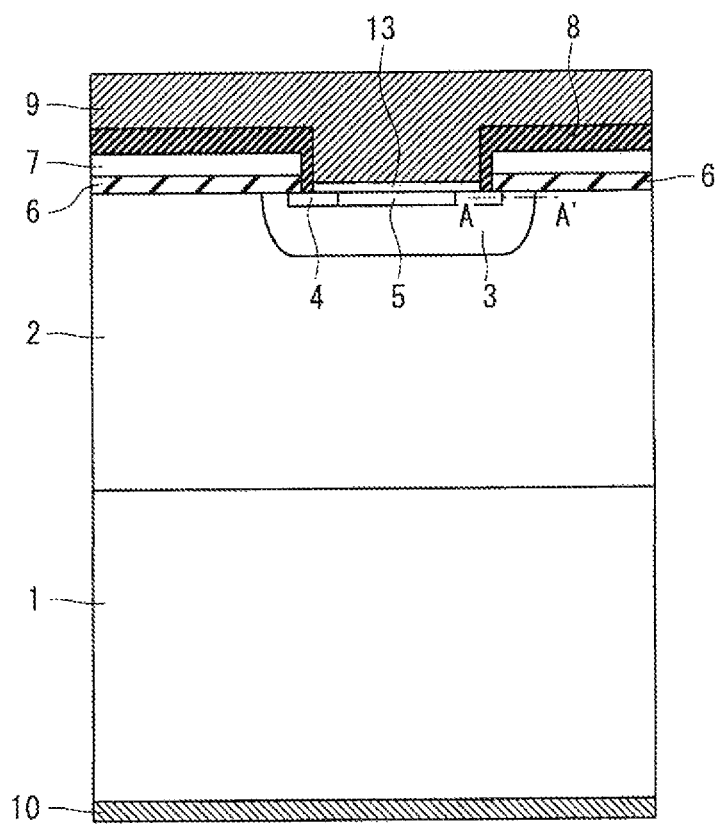
FIG. 13 is a schematic cross section showing a configuration of the wide band gap semiconductor device according to a preferred embodiment.
Figure 14:
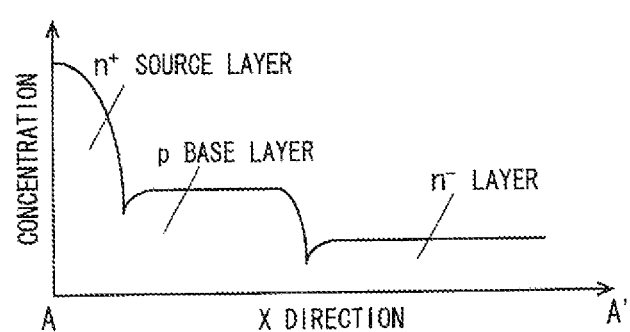
FIG. 14 is a diagram showing a concentration profile of A-A' in FIG. 13.
Figure 15:
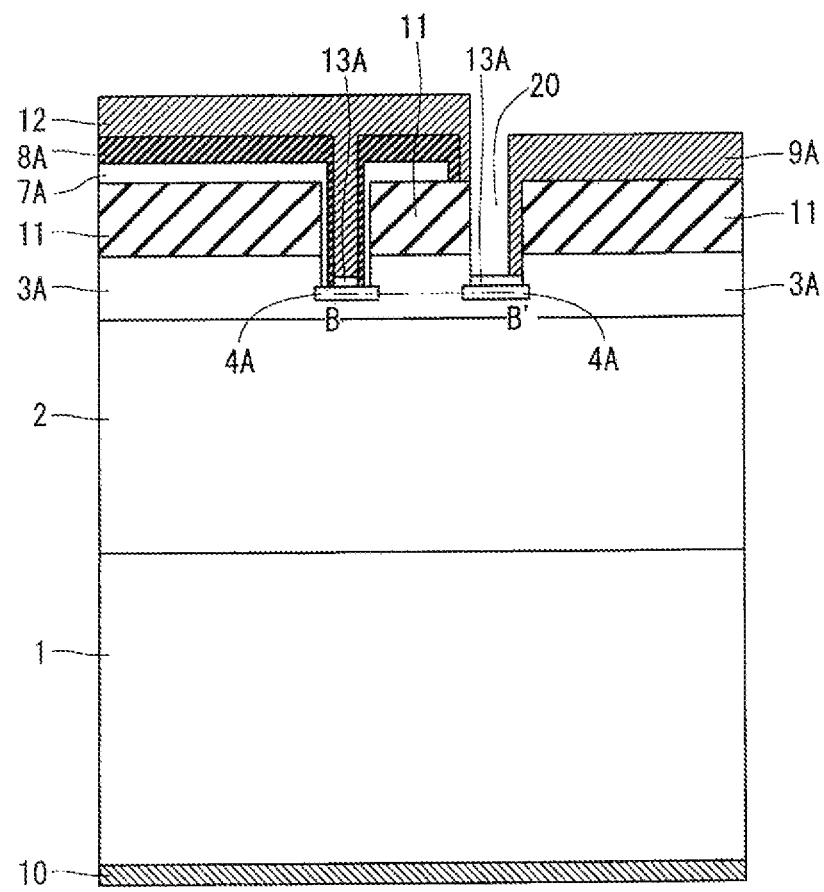
FIG. 15 is a schematic cross section showing a configuration of the wide band gap semiconductor device according to a preferred embodiment.
Figure 16:
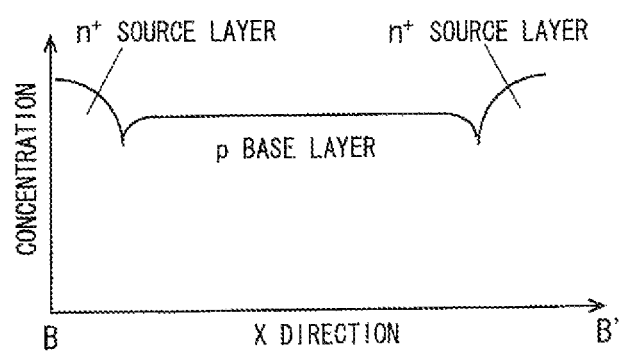
FIG. 16 is a diagram showing a concentration profile of B-B' in FIG. 15.

FIGS. 13 and 15 are schematic cross sections showing a configuration of the wide band gap semiconductor device according to the present preferred embodiment. FIG. 14 is a diagram showing a concentration profile of A-A' in FIG. 13. FIG. 16 is a diagram showing a concentration profile of B-B' in FIG. 15. In FIGS. 14 and 16, a vertical axis indicates the impurity concentration in each layer, and a horizontal axis indicates a position of an X-axis direction in a case where a horizontal direction in FIGS. 13 and 15 is the X-axis.

As shown in FIGS. 14 and 16, generally, the p base layer has a higher p-type concentration as it gets deeper from the surface layer of the n− layer 2. Consequently, the surface layer of the n− layer 2 is etched to form the recessed part 20 and the n⁺ source layer 4A of the horizontal n-channel MOSFET is formed inside the recessed part 20, which allows the n-channel of the n-channel MOSFET to be formed in a region having the higher p-type concentration than that of the active region of the SiC-MOSFET.

For this reason, without increasing the thickness of the gate insulating film, the horizontal n-channel MOSFET can obtain the higher VGSth than that of the active region (unit cell) of the SiC-MOSFET.

Therefore, even in the normal operation in which the maximum voltage rating is 20 V or less between the gate electrode and the source electrode, it is possible to contain the horizontal n-channel MOSFET having no effects on the normal operation of the SiC-MOSFET.

<Effects>

According to the present preferred embodiment, the wide band gap semiconductor device includes the recessed part 20 formed on the surface layer of the p base layer 3A (second base layer). The n⁺ source layer 4A is formed inside the recessed portion 20.

In general, the p base layer of the SiC-MOSFET has a higher concentration than that of the p-layer located deeper than the outermost surface of the SiC. Therefore, the surface of the SiC is etched to form the recessed part 20, and the horizontal n-channel MOSFET including the n⁺ source layer 4A located inside the recessed part 20 is formed, whereby a channel can be formed in the region having a higher concentration of the p-layer than that of the active region of the SiC-MOSFET.

For this reason, without increasing the thickness of the gate oxide film of the horizontal n-channel MOSFET, the higher threshold voltage between the gate electrode and the source electrode than that of the active region of the SiC-MOSFET can be obtained. Therefore, in the normal operation in which the maximum voltage rating is 20 V or less between the gate electrode and the source electrode, the horizontal n-channel MOSFET has no effects on the active region of the SiC-MOSFET and the normal operation of the current sense.

Though the material properties and the materials of the constituent members, the conditions for the executions, and the like have been described in the preferred embodiments, these are only exemplary ones and not limited to the described ones.

In addition, according to the present invention, the above preferred embodiments can arbitrarily combine the structural elements, or in each preferred embodiment, the structural elements can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A wide band gap semiconductor device, comprising:
   a vertical wide band gap semiconductor MOSFET including:
   a first base layer of a second conductivity type formed on a surface layer of a first conductivity type wide gap band semiconductor layer;
   a first source layer of a first conductivity type formed on a surface layer of said first base layer;
   a gate insulating film formed on said first base layer sandwiched between said first source layer and said wide band gap semiconductor layer;
   a first gate electrode formed on said gate insulating film;
   an interlayer insulating film formed to cover said first gate electrode,
   a first source electrode formed to cover said interlayer insulating film, said first base layer, and said first source layer; and
   a drain electrode formed below said wide band gap semiconductor layer; and
   a horizontal wide band gap semiconductor MOSFET including:
   a second base layer formed on the surface layer of said wide band gap semiconductor layer in the same step as that of forming said first base layer;
   a field insulating film formed on said second base layer;
   a second source layer formed on a surface layer of said second base layer in the same step as that of forming said first source layer to sandwich said field insulating film;
   a second gate electrode being the same layer as said first gate electrode and formed at least directly on said field insulating film;
   a third gate electrode formed on one of portions of said second source layer to be electrically connected to said second gate electrode; and
   a second source electrode formed on the other portion of said second source layer.

2. The wide band gap semiconductor device according to claim 1, wherein said second source electrode is the same layer as said first source electrode.

3. The wide band gap semiconductor device according to claim 1, wherein said second source electrode is a ground wiring in a terminal region formed to surround said vertical wide band gap semiconductor MOSFET.

4. The wide band gap semiconductor device according to claim 1, wherein said horizontal wide band gap semiconductor MOSFET has a threshold voltage of 25 V or more between said second gate electrode and said second source electrode.

5. The wide band gap semiconductor device according to claim 1, wherein said field insulating film is formed in a step of forming a peripheral region surrounding said vertical wide band gap semiconductor MOSFET.

6. The wide band gap semiconductor device according to claim 1, wherein said vertical wide band gap semiconductor MOSFET is a current sense MOSFET.

7. The wide band gap semiconductor device according to claim 1, wherein said horizontal wide gap semiconductor MOSFET is disposed in a gate pad region of said vertical wide gap semiconductor MOSFET.

8. The wide band gap semiconductor device according to claim 6, wherein said horizontal wide gap semiconductor MOSFET is disposed in a current sense pad region of said vertical wide gap semiconductor MOSFET.

9. The wide band gap semiconductor device according to claim 1, further comprising a recessed part formed on a surface layer of said second base layer,
   wherein said second source layer is formed inside said recessed part.

10. The wide band gap semiconductor device according to claim 1, wherein said wide band gap semiconductor is SiC or GaN.

\* \* \* \* \*